Feb. 8, 1966 N. H. FLETCHER 3,234,441

JUNCTION TRANSISTOR

Original Filed Dec. 27, 1954 2 Sheets-Sheet 1

INVENTOR.
NEVILLE H. FLETCHER
BY
William J. Flynn
ATTORNEY

INVENTOR.
NEVILLE H. FLETCHER
BY
William J. Flynn
ATTORNEY

United States Patent Office 3,234,441

Patented Feb. 8, 1966

3,234,441

JUNCTION TRANSISTOR

Neville H. Fletcher, Armidale, New South Wales, Australia, assignor, by mesne assignments, to International Telephone and Telegraph Corp., New York, N.Y., a corporation of Maryland Continuation of application Ser. No. 477,627, Dec. 27, 1954. This application Oct. 18, 1962, Ser. No. 231,503
5 Claims. (Cl. 317—234)

This invention relates to a junction transistor for high power operation.

This application is a continuation of my copending application Serial No. 477,627, filed December 27, 1954, which has become abandoned.

In the alloy junction transistor small discs of appropriate doping metal are alloyed to opposite major faces of a thin semiconductor wafer so as to form rectifying junctions therewith. For example, a P–N–P alloy junction transistor may be constructed by alloying indium discs to opposite major faces of an N-type germanium wafer, these discs serving as the emitter and collector, respectively, and with a base electrode making ohmic contact with the N-type germanium wafer. In the conventional configuration of the alloy junction transistor the emitter is in the form of a circular disc and the base electrode is connected to the semiconductor wafer relatively distant from the emitter. This conventional configuration is not well suited for high power operation. Due to the finite resistivity of the material of the semiconductor wafer and its finite thickness between the emitter and collector junctions, the base current when the transistor is in operation causes a reduction of the bias on the portions of the emitter junction remote from the base electrode. This severely limits the amount of current which a transistor of this configuration can carry. In particular, this configuration results in a reduced injected current density at the portions of the emitter junction spaced from the peripheral portions of the emitter at this junction which are closest to the base electrode. For example, in a typical transistor of this conventional configuration including a germanium wafer .001 inch thick, an emitter efficiency of substantially 100%, a minority carrier lifetime in the semiconductor wafer of 100 microseconds, and an injected current density at the periphery of the emitter junction of 10 amps/sq. cm., the injected current density at the emitter junction at a distance of 1 mm. inward from the emitter periphery is only about 4 amps/sq. cm. Any portions of the emitter further inward than this would be even more inefficient and thus it would be wasteful of materials to provide an emitter greater than about 2 mm. in diameter under these conditions. Such an emitter, under the typical conditions specified above, would have a total current capacity of only 300 milliamperes. Also, the concentration of current adjacent the periphery of the emitter tends to cause degradation of other operating characteristics of the transistor.

The present invention is directed to a novel transistor of the alloy junction or diffused junction type which overcomes the foregoing difficulties. In accordance with the present invention the emitter region, which makes rectifying junction contact with one face of the semiconductor wafer, is elongated and the base electrode region extends on both sides of the emitter in close proximity thereto. Substantially the whole of the emitter operates quite efficiently in injecting current into the semiconductor, and consequently the transistor is capable of passing much higher total currents without a deleteriously high injected current density at any particular point on the emitter junction.

Accordingly, it is an object of this invention to provide a novel junction transistor which is capable of improved high current, high power operation.

It is also an object of the present invention to provide a novel junction transistor which has a reduced base resistance, with consequent high power gain.

Another object of this invention is to provide a novel and improved junction transistor which may be easily fabricated and which has good thermal and mechanical properties.

Another object of this invention is to provide a novel and improved junction transistor whose design parameters can be easily modified to give any desired power handling capacity.

Other and further objects and advantages of the present invention will be apparent from the following description of several preferred embodiments thereof, illustrated in the accompanying drawing.

Figure 1:
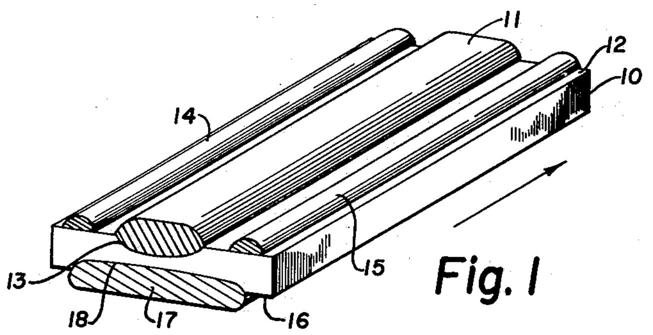
FIGURE 1 is a perspective view, with one end broken away, showing a transistor operative in accordance with the general principles of the present invention.

Referring to FIGURE 1, illustrating the general principles of the present invention, a thin slab 10 of semiconductor material, such as germanium, is suitably doped with an appropriate impurity to make it of one conductivity type. For example, it may be doped with an extremely small amount of donor impurity, such as antimony or arsenic, to make it N-type. An emitter region 11 is bonded to one major face 12 on the semiconductor slab. This emitter region is formed by alloying or diffusing suitable acceptor material, such as indium, to that face of the semiconductor slab. The acceptor material penetrates into the semiconductor slab, and adjacent the interface between emitter region 11 and semiconductor slab 10 the emitter region presents a low resistivity region of semiconductive indium-doped germanium of P-type conductivity, which makes a rectifying junction with the N-type semiconductor slab 10 at their interface 13. The emitter region 11 is elongated in the direction of the major dimension of that major face on the semiconductor slab.

A pair of base electrode regions 14 and 15 are bonded to the same major face 12 on the semiconductor slab, making ohmic contact therewith along their entire lengths, respectively, on opposite sides of the emitter. These base electrode regions are of highly electrically conductive material and are elongated in the same direction as the emitter, extending in parallel, close, equally spaced relationship to the opposite side edges of the emitter.

On the opposite major face 16 of the semiconductor slab is diffused or alloyed an elongated collector 17 of acceptor material, such as indium. The acceptor material penetrates into the semiconductor slab to provide a low resistivity semiconductive indium-doped germanium region of conductivity type opposite to that of the semiconductor slab itself adjacent the junction interface 18 between the collector and the semiconductor slab. The collector makes rectifying junction contact with the semiconductor slab directly opposite the entire length of the emitter 11 and is slighly wider than the emitter.

In operation, the two base electrode regions 14 and 15 are connected together electrically by suitable external means. It will be apparent that the base current flow in the semiconductor slab 10 is perpendicular to the direction of elongation of the emitter and base. Because of this direction of the base current and elongation of the emitter and base regions, as well as the close spacing between the emitter and base regions, the total voltage drop in the device due to base current is minimized. The emitter current may be increased to any desired value without resulting in an increase in the current density simply by extending the length of the semiconductor slab and the electrode regions.

Figure 2:
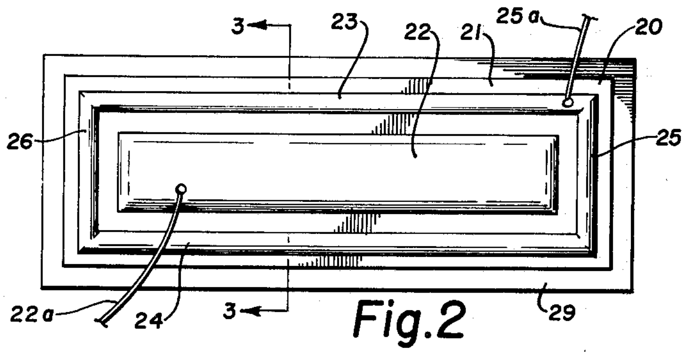
FIGURE 2 is a plan view of a transistor embodying the principles of this invention.
Figure 3:
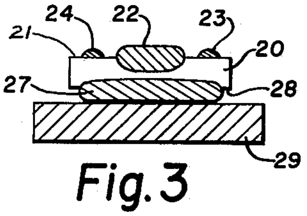
FIGURE 3 is a section taken along the line 3—3 in FIGURE 2.

A practical form of transistor, which embodies the basic principles illustrated in FIGURE 1, is shown in FIGURES 2 and 3. In this configuration the elongated thin rectangular semiconductor slab 20 of one conductivity type has alloyed or diffused onto one of its major faces 21 an elongated emitter 22 of material which provides a semiconductive region of opposite conductivity type making rectifying junction contact with the semiconductor slab and elongated in the direction of elongation of the semiconductor slab itself. A lead-in wire 22*a* of copper or the like is soldered to the emitter 22 at any convenient location thereon. The base electrode is in the form of two elongated regions 23 and 24 of suitable material, such as solder, which makes ohmic contact with the semiconductor slab on opposite sides of the emitter 22 in close, equally spaced, parallel relation to the adjacent side edges of the emitter. The elongated base electrode regions 23 and 24 are interconnected at their ends by further base electrode regions 25 and 26 which extend across the ends of the emitter and make ohmic contact with the semiconductor slab. Thus, the several base electrode regions form a rectangle which extends completely around the emitter 22 in closely spaced relation thereto. A lead-in wire 25*a* is soldered to any desired portion of the base electrode. The collector electrode 27 is alloyed or diffused to the opposite major face 28 on the semiconductor slab and provides a semiconductive region of opposite conductivity type which makes rectifying junction contact with the semiconductor slab. The collector region extends across an area substantially equal to that bounded by the base electrode on the first-mentioned major face 21 of the semiconductor slab. Both the emitter region and collector region penetrate into the semiconductor slab, as in FIGURE 1. The collector is soldered to a copper plate 29, to which external electrical connection is made.

In this embodiment, the operation is essentially as described above, with substantially all of the base current flow being in a direction perpendicular to the direction of elongation of the emitter electrode. The base electrode regions 25 and 26 serve essentially as a convenient means for electrically interconnecting the major, elongated base electrode regions 23 and 24. In a specific embodiment of this particular configuration the semiconducting body 20 is of N-type germanium of 1–5 ohm cm. resistivity, the dimensions of the semiconducting slab are 0.600″ x 0.200″ x .020″, the indium emitter region is 0.400″ x .070″ and the indium collector region 0.500″ x 0.150″. The closest spacing between the emitter and collector interfaces is 0.001″ and the spacing between the emitter and base electrodes is .030″. This transistor has a current capacity of several amperes.

Figure 4:
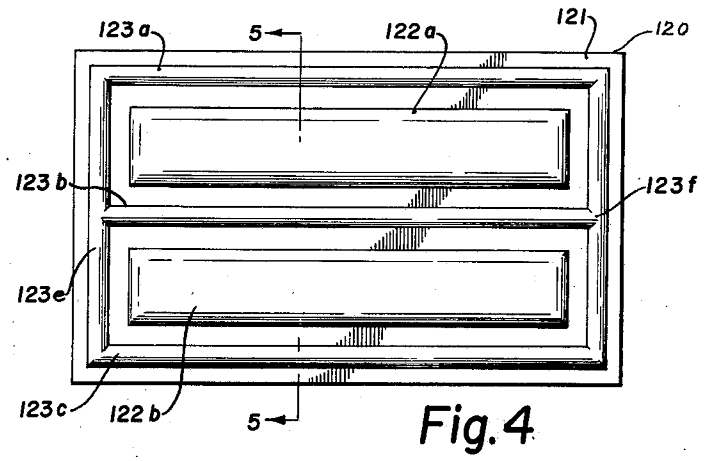
FIGURE 4 is a plan view of a second embodiment of this invention.
Figure 5:
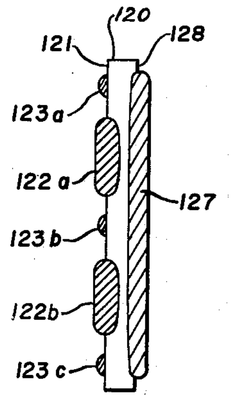
FIGURE 5 is a section taken along the line 5—5 in FIGURE 4.

A further modification is shown in FIGURES 4 and 5.

Here the thin semiconductor slab 120 of one conductivity type has alloyed or diffused onto one of its major faces 121 a pair of spaced parallel elongated emitter regions 122*a* and 122*b*, each of which makes elongated rectifying junction contact with this face of the semiconductor slab. The base electrode comprises three elongated regions 123*a*, 123*b* and 123*c*, disposed respectively on opposite sides of the emitter regions and in close proximity thereto, substantially parallel to the emitter regions. These base electrode regions are interconnected by further base electrode regions 123*e* and 123*f*, which extend across the ends of the emitter regions. All of these base electrode regions are of high conductivity material making ohmic contact with the major face 121 of the semiconductor slab. The collector electrode 127 is alloyed or diffused onto the opposite major face 128 of the semiconductor slab and makes rectifying contact therewith across an area of said face slightly greater than that bounded by the base electrode regions 123*a*, 123*e*, 123*c* and 123*f* on the first major face 121 of the semiconductor slab and directly opposite that area bounded by these base electrode regions. Both emitters, as well as the collector, penetrate into the semiconductor slab and provide semiconductive regions of conductivity type opposite to that of the semiconductor slab which make rectifying junctions with the semiconductor slab. The external electrical connections (not shown) preferably are similar to those shown in FIGURES 2 and 3.

In this modification substantially all of the base current flows substantially perpendicular to the direction of elongation of the emitter regions, with a consequent increase in over-all current carrying capacity of the transistor.

Figure 6:
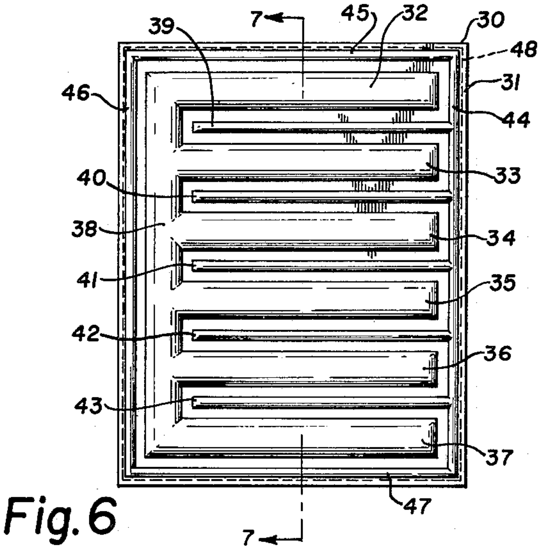
FIGURE 6 is a plan view showing a third transistor configuration according to the present invention.
Figure 7:
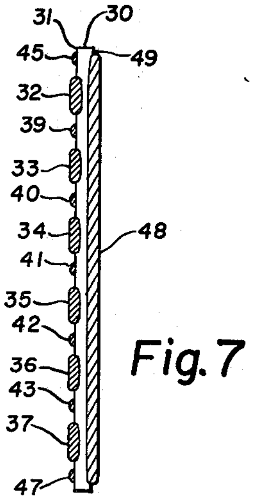
FIGURE 7 is a section taken along the line 7—7 in FIGURE 6.

A further embodiment of this invention is shown in FIGURES 6 and 7. In this device the thin slab 30 of semiconductor material of one conductivity type is of rectangular shape. Alloyed or diffused to one major face 31 on the semiconductor body are a plurality of elongated, spaced, parallel emitter regions 32, 33, 34, 35, 36 and 37, which may be interconnected at one end by an emitter region 38 to provide a comb-like configuration. Each of the emitter regions makes elongated rectifying junction contact with the semiconductor slab. The base electrode comprises a plurality of elongated base electrode regions 39, 40, 41, 42 and 43, making ohmic contact with the same face on the semiconductor slab and each of which is disposed between a pair of adjacent emitter regions in close, equally spaced, parallel relation therewith. The base electrode regions 39–43 in this instance interconnected by an elongated base electrode region 44, which forms one side of a rectangular base electrode configuration surrounding the entire emitter electrode region, the other sides of this rectangle being formed by the elongated base electrode regions 45, 46 and 47. The base electrode regions 45 and 47 extend in closely spaced, parallel relation to the emitter regions 32 and 37, respectively. A collector region 48 is alloyed or diffused to the opposite major face 49 on the semiconductor slab and makes rectifying junction contact therewith. The collector region is rectangular in shape and extends slightly beyond the outline 44, 45, 46, 47 of the base electrode. The material of both the emitter and collector electrodes penetrates into the material of the semiconductor slab, as indicated in FIGURE 7, and provide semiconductive regions of conductivity type opposite to that of the semiconductor slab and which make rectifying junctions therewith. The external electrical connections (not shown) may be made as illustrated in FIGURES 2 and 3.

In the operation of this device, substantially all of the base current flows perpendicular to the elongated emitter regions 32–37, with a consequent decrease in current density variations and increase in the overall current carrying capacity of the device. In one specific embodiment, a transistor having the general configuration shown in FIGURE 6 was fabricated with five parallel emitter portions on an N-type germanium slab 1.0 inch by 1.0 inch by .020 inch. A second embodiment of this type had two parallel emitter regions on an N-type germanium slab 0.6 inch by 0.4 inch by .020 inch. Both of these devices had current carrying capacities in tens of amperes.

Figure 8:
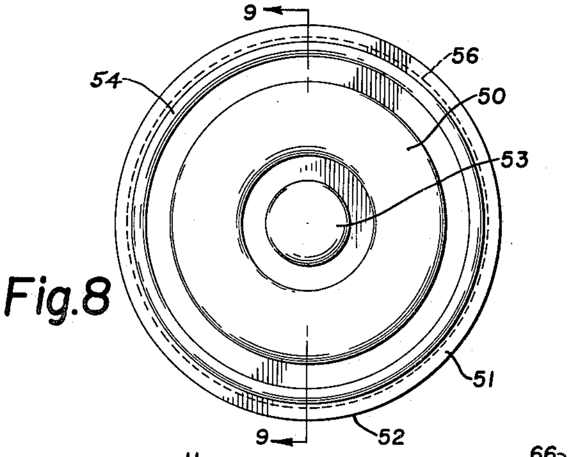
FIGURE 8 is a plan view of a fourth transistor configuration in accordance with this invention.
Figure 9:
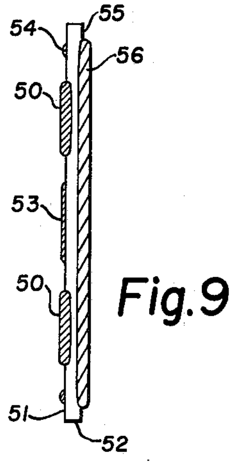
FIGURE 9 is a section taken along the line 9—9 in FIGURE 8.

In the embodiment of FIGURES 8 and 9, the emitter is in the form of a circular annulus 50 of low resistivity material diffused or alloyed to one major face 51 on the thin, circular semiconductor slab 52. The emitter provides a semiconductive region of opposite conductivity type to that of the semiconductor slab in rectifying junction contact with the semiconductor slab throughout the annular extent of the emitter. An inner base electrode region in the form of a circular disc 53 surrounded by the emitter region 50 makes ohmic contact with the same major face 51 on the semiconductor slab, with its circular peripheral edge extending in closely spaced relation to the inner edge of the emitter region 50 and parallel thereto. An outer base electrode region in the form of a circular annulus 54, which surrounds the emitter region 50, makes ohmic contact with the same major face on the semiconductor slab. This outer base electrode region extends in parallel, closely spaced relation to the outer edge of the emitter region. Preferably the spacings between the emitter region and the inner and outer base electrode regions are equal. A collector electrode 56 is diffused or alloyed to the opposite major face 55 of the semiconductor slab and provides a semiconductive region of opposite conductivity type which makes rectifying junction contact with the semiconductor slab. In the illustrated embodiment the collector region 56 is circular and extends slightly beyond the outer peripheral edge of the outer base electrode 54. The external electrical connections to the various electrodes may be as shown in FIGURES 2 and 3.

In operation, the inner and outer base electrode regions are interconnected through a suitable external connection. Base current flows through the semiconductor slab 52 radially inward and outward from the annular emitter region 50, substantially perpendicular to the emitter region and to both base electrode regions.

Figure 10:
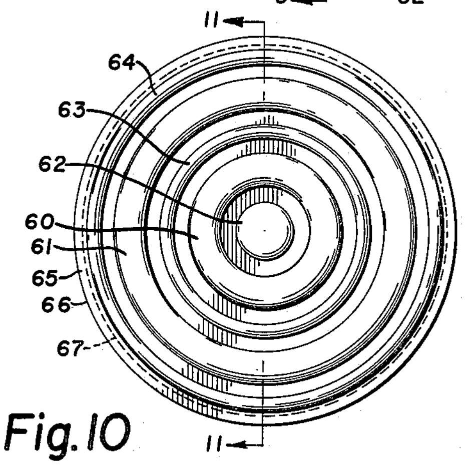
FIGURE 10 is a plan view of a still further transistor configuration in accordance with this invention.
Figure 11:
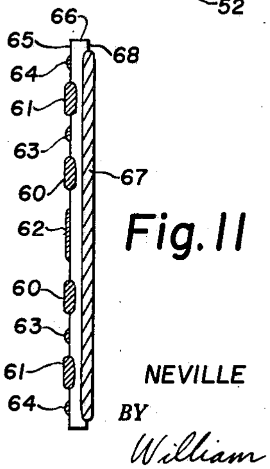
FIGURE 11 is a section taken along the line 11—11 in FIGURE 10.

A modification of the FIGURE 8 embodiment is illustrated in FIGURES 10 and 11, wherein there are provided two concentrically disposed circular emitter regions 60 and 61, and three concentrically disposed base electrode regions 62, 63 and 64, the innermost base region 62 being in the form of a circular dot disposed concentrically within the inner emitter region 60, the intermediate base electrode region 63 being in the form of an annulus positioned concentrically between the inner and outer emitter regions 60 and 61, and the outer base electrode region 64 being in the form of an annulus which surrounds the outer emitter region 61 concentric therewith. The inner and outer emitter regions 60 and 61 are alloyed or diffused to one major face 65 of the thin circular semiconductor body 66 and provide semiconductive regions of opposite conductivity type to that of the semiconductor body which make elongated rectifying junction contacts with the semiconductor body. The base electrodes are of high conductivity material and make ohmic contact with the semiconductor body. The collector electrode 67 is alloyed or diffused to the opposite major face 68 on the semiconductor body and provides a semiconductive region of opposite conductivity type to that of the semiconductor body which makes rectifying junction contact with an area of the semiconductor body which extends slightly beyond that bounded by the outer base electrode 64.

The emitter regions 60 and 61 are connected together electrically through an external connection, and the base electrode regions 62, 63 and 64 are similarly interconnected electrically. In operation, base current to the inner base electrode region 62 flows radially inward through the semiconductor body from the inner emitter region 60, base current to the intermediate base electrode region 63 flows through the semiconductor body radially outward from the inner emitter region 60 and radially inward from the outer emitter region 61, and base current to the outer base electrode region 64 flows through the semiconductor body radially outward from the outer emitter region 61. Thus all of the base currents flow perpendicular to the lengths of the respective elongated emitter regions, as in the preceding embodiments of this invention.

Obviously, the principles of the present invention may be extended to provide any desired number of concentric emitter and base electrode regions.

Furthermore, it is to be understood that various other modifications and refinements departing from the specific embodiments illustrated in the accompanying drawings may be adopted without departing from the spirit and scope of the present invention.

In each of the foregoing embodiments of the present invention for optimum performance certain design factors must be considered. From the viewpoint only of the bias cut-off effect the emitter electrode should be as narrow as possible since improved efficiency results. However, the number of minority carriers lost at the surface due to surface recombination is approximately proportional to the emitter periphery, so that with very thin emitters, having a large ratio of periphery to total area, this effect is proportionately more severe. Also, since the transistor is made by an alloying or diffusion process and the depth of penetration is finite, in order that the base region be as uniformly thin as possible the emitter width should be large compared to the alloying depth. Also, very narrow emitters will be mechanically weak and difficult to fabricate. The relative importance of these various factors depends upon many things—surface recombination velocity, which is closely dependent upon the etching technique used, being one of the most important. Therefore, experimentation and experience are necessary in order to arrive at the optimum emitter width for any particular type of fabrication technique used. For commonly available germanium within the resistivity range from 1 to 3 ohm-cm., with a base layer thickness of .001 inch to .002 inch, and emitter current densities of 10 to 50 amps./sq. cm. an emitter width of about 2 mm. has been found to be approximately the optimum.

The base electrodes should be equally spaced from the emitter and as close to the emitter as possible, the closeness being dictated primarily by mechanical considerations.

From the viewpoint of collection efficiency, the collector electrode should be as large as possible, but on the other hand increasing the collector area increases the saturation current and also increases the likelihood that the collector region will contain some serious crystal imperfection. In practice, if the collector is made to extend 1 or 2 diffusion lengths sideways beyond the emitter, the collection will be sufficiently good.

What is claimed and desired to be secured by United States Letters Patent is:

1. A circuit element comprising a thin slab of semiconductor material of one conductivity type having opposite major faces, an elongated emitter electrode bonded to one of the major faces of the semiconductor slab presenting an elongated region of opposite conductivity type making an elongated rectifying emitter junction contact with said one major face, said rectifying emitter junction contact throughout at least most of its length having a width not greater than 2 mm., base electrode regions in ohmic contact with said one major face of the semiconductor body on opposite sides of the emitter electrode in closely spaced substantially parallel relationship to the emitter junction contact along substantially the entire length of the latter, said base electrode regions along substantially their entire length having a spacing from the rectifying emitter junction contact not substantially greater than one-half the width of the rectifying emitter junction contact, and a collector region of opposite conductivity type forming a rectifying collector junction contact with the other major face of said slab.

2. A circuit element comprising a thin slab of semiconductor material of one conductivity type having opposite major faces, an elongated emitter electrode bonded to one of the major faces of the semiconductor slab presenting an elongated region of opposite conductivity type making an elongated rectifying emitter junction contact with said one major face, said rectifying emitter junction contact throughout at least most of its length having a width not greater than 2 mm., base electrode regions in ohmic contact with said one major face of the semiconductor body on opposite sides of the emitter electrode in closely spaced substantially parallel relationship to the emitter junction contact along substantially the entire length of the latter, said base electrode regions along substantially their entire length having a spacing from the rectifying emitter junction contact not substantially greater than one-half the width of the rectifying emitter junction contact, and a collector region of opposite conductivity type forming a rectifying collector junction contact with the other major face of said slab, said rectifying collector junction contact being spaced from said rectifying emitter junction contact a distance which is at least one order of magnitude closer than the spacing between said rectifying emitter junction contact and base electrode regions.

3. A circuit element comprising a thin slab of semiconductor material of one conductivity type having opposite major faces, an emitter electrode bonded to one of the major faces of the semiconductor slab presenting a region of opposite conductivity type making a rectifying emitter junction contact with said one major face, said emitter electrode including a plurality of elongated emitter regions making narrow elongated rectifying junction contacts with said one major face in spaced relation to each other and an additional emitter region joined to each of said elongated emitter regions at one end thereof and making rectifying junction contact with said one major face, each of said elongated emitter regions extending away from said additional emitter region and terminating at its opposite end remote from said additional emitter region, each said rectifying emitter junction contact throughout at least most of its length having a width not greater than 2 mm., a base electrode including base electrode regions interconnected to have the same potential and in direct ohmic contacts with said one major face of the semiconductor body on opposite sides of each elongated emitter region in closely spaced substantially parallel relationship to the emitter junction contact along substantially the entire length of the latter, each said base electrode region along substantially its entire length having a spacing from the rectifying emitter junction contact not substantially greater than one-half the width of the rectifying emitter junction contact, said base electrode including portions respectively extending across said opposite end of each elongated emitter region in close proximity thereto and interconnecting the respective elongated base regions which are on opposite sides of that elongated emitter region and said base electrode extends continuously completely around the periphery of said emitter electrode in close proximity thereto throughout the latter's extent on said one major face and a collector region of opposite conductivity type forming rectifying collector junction contact with the other major face of said slab, said rectifying collector junction contact being spaced from said rectifying emitter junction contact a distance which is at least one order of magnitude closer than the spacing between said rectifying emitter junction contact and base electrode regions.

4. A circuit element comprising a thin slab of semiconductor material of one conductivity type having opposite major faces, an emitter electrode bonded to one of the major faces of the semiconductor slab presenting a region of opposite conductivity type making a rectifying emitter junction contact with said one major face, said emitter electrode including a plurality of elongated emitter regions making narrow elongated rectifying junction contacts with said one major face in spaced relation to each other, each said rectifying emitter junction contact throughout at least most of its length having a width not greater than 2 mm., a base electrode including base electrode regions interconnected to have the same potential and in direct ohmic contact with said one major face of the semiconductor body on opposite sides of each elongated emitter region in closely spaced substantially parallel relationship to the emitter junction contact along substantially the entire length of the latter, each said base electrode region having a spacing from the adjacent rectifying emitter junction contact not substantially greater than one-half the width of the rectifying emitter junction contact along substantially its entire length, and a collector region of opposite conductivity type forming a rectifying collector junction contact with the other major face of said slab, said rectifying collector junction contact being spaced from said rectifying emitter junction contact a distance which is at least one order of magnitude closer than the spacing between said rectifying emitter junction contact and base electrode regions.

5. A circuit element comprising a thin slab of semiconductor material of one conductivity type having opposite major faces, an emitter electrode bonded to one of the major faces of the semiconductor slab presenting a region of opposite conductivity type making a rectifying emitter junction contact with said one major face, said emitter electrode including a plurality of elongated emitter regions making narrow elongated rectifying junction contacts with said one major face in spaced relation to each other, each said rectifying emitter junction contact throughout at least most of its length having a width not greater than 2 mm., a base electrode including base electrode regions interconnected to have the same potential and in direct ohmic contacts with said one major face of the semiconductor body on opposite sides of each elongated emitter region in closely spaced substantially parallel relationship to the emitter junction contact along substantially the entire length of the latter, each said base electrode region along substantially its entire length having a spacing from the adjacent rectifying emitter junction contact not substantially greater than one-half the width of the rectifying emitter junction contact, said base electrode extends continuously completely around the periphery of said emitter regions in close proximity thereto throughout the latter's extent on said one major face and a collector region of opposite conductivity type forming a rectifying collector junction contact with the other major face of said slab, said rectifying collector junction contact being spaced from said rectifying emitter junction contact a distance which is at least one order of magnitude closer than the spacing between said rectifying emitter junction contact and base electrode regions.

References Cited by the Examiner

UNITED STATES PATENTS

| | | | |
|---|---|---|---|
| 2,618,690 | 11/1952 | Stuetzer | 317—235 |
| 2,644,852 | 7/1953 | Dunlap | 317—235 |
| 2,672,528 | 3/1954 | Shockley | 317—235 |
| 2,953,730 | 9/1960 | Pantchechnikoff et al. | 317—235 |
| 2,999,195 | 9/1961 | Saby | 317—235 |

JOHN W. HUCKERT, *Primary Examiner.*

JAMES D. KALLAM, DAVID J. GALVIN, *Examiners.*